(12) United States Patent
Shields

(10) Patent No.: US 6,245,681 B1
(45) Date of Patent: Jun. 12, 2001

(54) DUAL TEMPERATURE NITRIDE STRIP PROCESS

(75) Inventor: Jeffrey A. Shields, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/490,819

(22) Filed: Jan. 25, 2000

(51) Int. Cl.$^7$ .................................................. H01L 21/311
(52) U.S. Cl. ............................................................ 438/694
(58) Field of Search ..................................... 438/694, 704, 438/706, 714, 715, 716, 717, 719, 723, 724, 738, 740, 744, 750, 757

(56) References Cited

U.S. PATENT DOCUMENTS

| | | | |
|---|---|---|---|
| 4,877,962 | 10/1989 | Ohsaki et al. | 250/442.1 |
| 5,607,543 | * 3/1997 | Eisenberg et al. | 156/662.1 |
| 5,827,774 | 10/1998 | Kitajima | 438/525 |
| 5,843,850 | * 12/1998 | Shin et al. | 438/757 |
| 5,887,607 | 3/1999 | Malinowski et al. | 134/172 |
| 6,087,273 | * 7/2000 | Torek et al. | 438/756 |
| 6,117,351 | * 9/2000 | Li et al. | 216/99 |

OTHER PUBLICATIONS

Article/"The Etching of Silicon Nitride in Phosphoric Acid with Silicon Dioxide as a Mask"/W. van Gelder and V. E. Hauser, pp. 869–872.

Article/"Mechanistic Study of Silicon–Nitride–Etching with Hot Phosphoric Acid"/Tohoku University: K. Sato, F.W. Kern, T. Ohmi/Nihon Chemical Industrial Co., Ltd: Y. Yamazaki, G. Sato/Nisso Engireeing Co., Ltd.: T. Kaji, H. Horiki, pp. 1–8, drawings (10 figures, 11 pages).

* cited by examiner

*Primary Examiner*—David Nelms
*Assistant Examiner*—Quoc Hoang
(74) *Attorney, Agent, or Firm*—Lariviere, Grubman & Payne, LLP

(57) ABSTRACT

The invention provides an improved nitride mask etching process. The invention uses two acid baths at different temperatures to remove the nitride mask. A first bath at a higher temperature more quickly removes most of the nitride mask. The first bath can hold a higher concentration of silicon, but is less selective. A second bath at a lower temperature removes the remainder of the nitride mask. The second bath is more selective, minimizing the etch of the pad oxide. Since the second bath does less etching, defects are minimized, even though the second bath is not able to hold a higher concentration of silicon. Since only a small amount of nitride is removed, the slow etch rate of the second bath still provides a sufficient output.

12 Claims, 5 Drawing Sheets

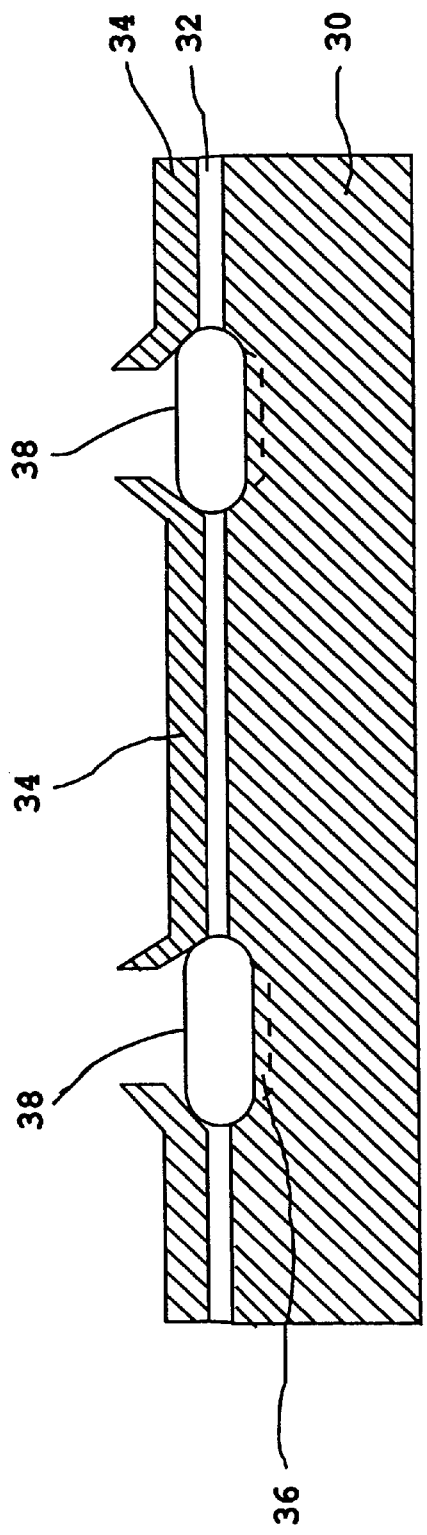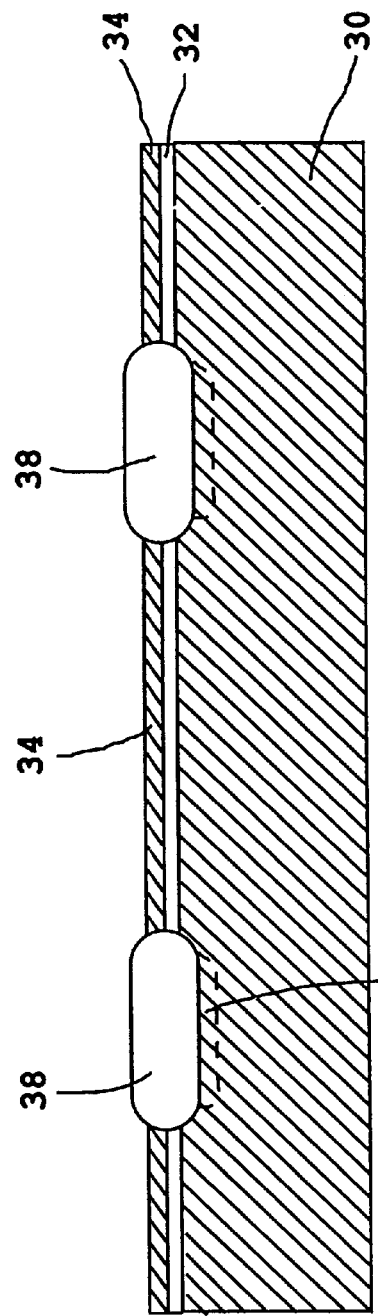

DUAL TEMPERATURE NITRIDE STRIP PROCESS

FIELD OF THE INVENTION

The present invention relates to the manufacture of semiconductor chips. More specifically, the present invention relates to a nitride strip process in the manufacture of semiconductor chips.

BACKGROUND OF THE INVENTION

Nitride layers are used in several places in the fabrication of semiconductor chips. Nitride layers are used as a hard mask for conventional LOCOS field oxide formation. They are also used as a hard mask and oxide polish stop for shallow trench isolation (STI). In both LOCOS field oxide formation and shallow trench isolation, the nitride layer is deposited on a thin pad oxide layer (100 to 250 Å), and the nitride must be removed after field oxide formation. Typically, the nitride is removed in a phosphoric acid ($H_3PO_4$) bath. The phosphoric acid is mixed with water and held in a boiling state in a closed system, so that the vapor is recondensed into the bath. The temperature at which the phosphoric acid and water mixture boils is a function of the concentration of the phosphoric acid and atmospheric pressure. The temperature for the boiling point at 760 mm Hg of the phosphoric acid and water mixture ranges from 100° C. (pure water) to approximately 250° C. (pure phosphoric acid). The range of temperatures for a phosphoric acid bath is typically from 130° C. to 170° C.

"The Etching of Silicon Nitride in Phosphoric Acid with Silicon Dioxide as a Mask" by W. van Gelder and V. E. Hauser, J. Electrochem. Soc., Solid State Science. vol. 114, No. 8, pp.869–872 (1967) discloses that nitride, oxide, and silicon etch rates increase exponentially with the increase in temperature with different activation energies. Thus, nitride:oxide and nitride:silicon selectivities are also a function of temperature. At higher temperatures, although the etch rates of nitride, oxide, and silicon are higher, nitride:oxide and nitride:silicon selectivities are lower.

"Mechanistic Study of Silicon-Nitride-Etching with Hot Phosphoric Acid" by K. Sato (Tohoku University), F. W. Kern (Tohoku University), T. Ohmi (Tohoku University), Y. Yamazaki (Nihon Chemical Industrial Co., ltd.), G. Sato (Nihon Chemical Industrial Co. ltd.), T Kaji (Nisso Engineering Co., ltd.), and H. Horiki (Nisso Engineering Co., ltd) discloses that the solubility of silicon increases as the temperature of the phosphoric acid bath increases. The nitride etching process adds silicon to the phosphoric acid bath. As more silicon wafers are run through the phosphoric acid bath, the silicon concentration in the bath increases. Once the silicon concentration reaches the saturation point, silicon precipitates are formed, which can deposit as defects. The phosphoric acid bath should be changed before the silicon begins to precipitate.

In addition, in the formation of semiconductors which use a nitride mask, often the process produces a thin oxide layer over the nitride mask. Highly selective etching of the nitride layer may be slowed by the thin oxide layer.

It would be desirable to obtain faster etch rates with high nitride:oxide and nitride:silicon selectivities. It would also be desirable to minimize the changing of phosphoric acid baths without increasing silicon precipitates.

BRIEF SUMMARY OF THE INVENTION

It is an object of the invention to obtain faster etch rates with high nitride:oxide and nitride: silicon selectivities.

It is another object of the invention to minimize the changing of phosphoric acid baths without increasing silicon precipitates.

Accordingly, the foregoing objects are accomplished on a semiconductor substrate, by forming a nitride layer on the semiconductor substrate; providing a first bath of phosphoric acid with a concentration of $P_2O_5$ where the concentration of $P_2O_5$ by weight percent is greater than about 63%; providing a second bath of phosphoric acid with a concentration of $P_2O_5$ where the concentration of $P_2O_5$ by weight percent is less than about 58%; etching away part of the nitride layer by placing the semiconductor substrate with the nitride layer into the first bath; removing the semiconductor substrate from the first bath; etching away part of the nitride layer by placing the substrate with the nitride layer into the second bath; and removing the semiconductor substrate from the second bath.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein:

FIG. 3 is a cross sectional view of part of a semiconductor wafer with an incomplete LOCOS structure before nitride etching.

FIG. 4 is a cross sectional view of the semiconductor wafer shown in FIG. 3 after removal from the first acid bath.

Figure 1:
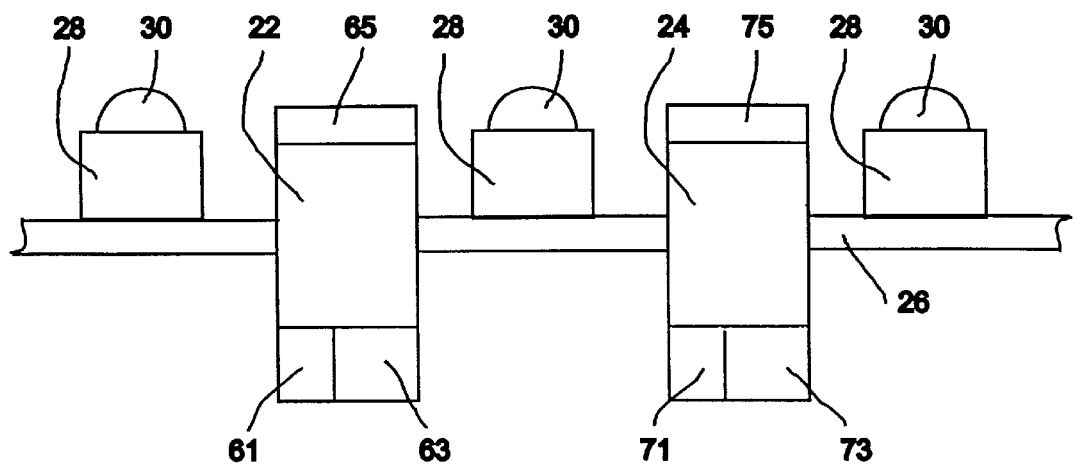
FIG. 1 is a schematic illustration of the acid baths used in a preferred embodiment of the invention.

Reference numbers refer to the same or equivalent parts of the present invention throughout the several figures of the drawing.

DETAILED DESCRIPTION OF THE INVENTION AND BEST MODE OF THE INVENTION

Figure 2:
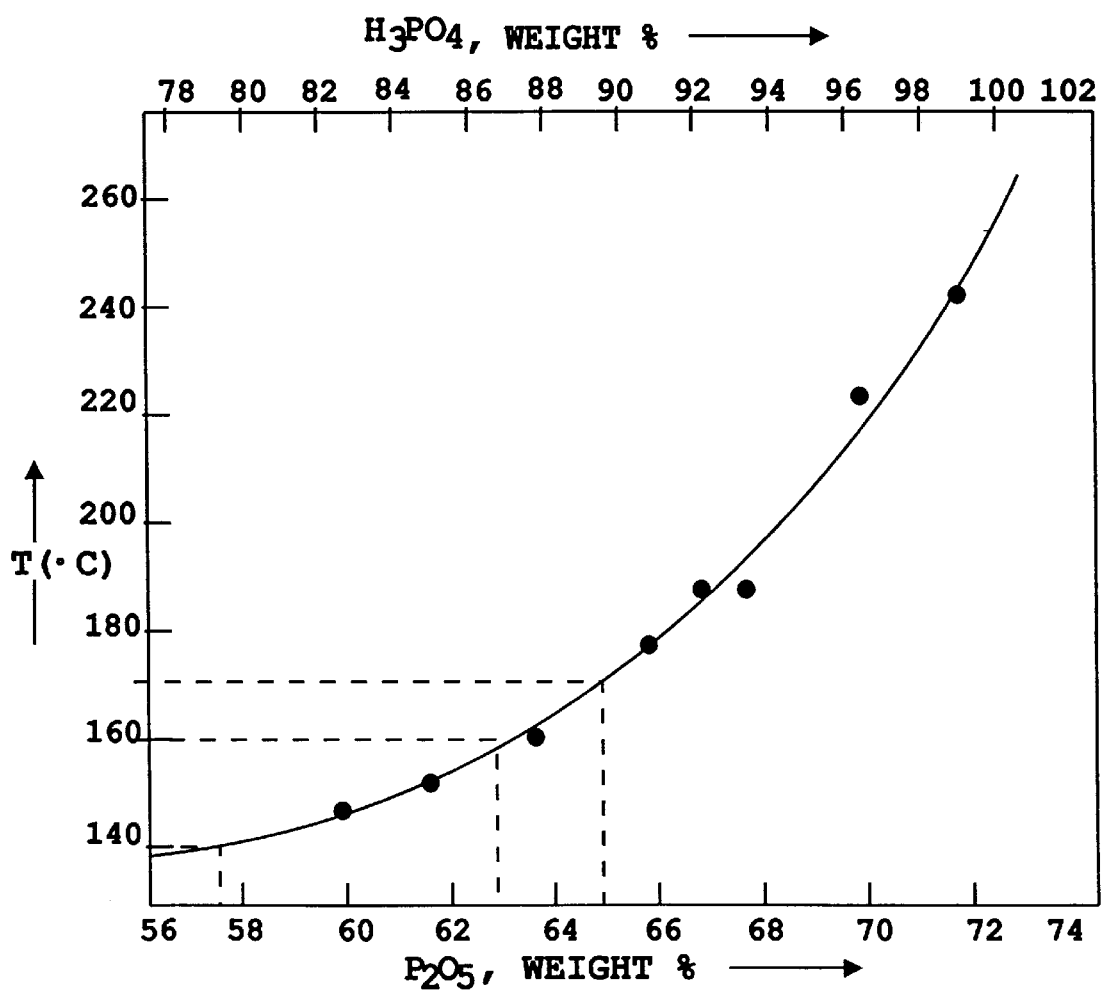
FIG. 2 is a graph of the boiling point of phosphoric acid at 760 mm Hg (1 atmosphere) versus the concentration of phosphoric acid.

FIG. 1 schematically illustrates a first phosphoric acid bath 22 and a second phosphoric acid bath 24 placed along a conveyor system 26. The conveyor system 26 transports carriers 28, which hold semiconductor wafers 30. The first phosphoric acid bath 22 has a phosphoric acid and water mixture with a boiling point greater than 160° C. FIG. 2 is a graph of the boiling point of phosphoric acid at 760 mm Hg (1 atmosphere) versus the concentration of phosphoric acid. The temperature plotted along the ordinate axis in degrees Centigrade. The concentration of $P_2O_5$ by weight percent is plotted along the bottom abscissa. The concentration of $H_3PO_4$ by weight percent is plotted along the top abscissa. In the phosphoric acid mixture we have the reactions:

3H$_2$O+P$_2$O$_5$ 2H$_3$PO$_4$ 6H+2PO$_4^{+3}$

FIG. 2 indicates that when the boiling point of the phosphoric acid is greater than 160° C., the concentration of P$_2$O$_5$ is greater than about 63%. Therefore in the preferred embodiment, in the first phosphoric acid bath 22 the concentration of P$_2$O$_5$ by weight percent is greater than about 63%. More preferably, the first phosphoric acid bath 22 has a boiling point of greater than about 170° C. or the concentration of P$_2$O$_5$ of about 65%. More preferably, the first phosphoric acid bath 22 has a boiling point of about 170° C. or the concentration of P$_2$O$_5$ is about 65%. A first heater 61 is connected to the first phosphoric acid bath 22 and heats the phosphoric acid to the boiling point. A first changing system 63 is connected to the first phosphoric acid bath 22 and replaces older phosphoric acid with fresh phosphoric acid. A first recondenser 65 is connected to the first phosphoric acid bath 22 keeping the first phosphoric acid bath in a closed system by recondensing vapor from the first phosphoric bath 22 back into the first phosphoric bath 22.

The second phosphoric acid bath 24 has a phosphoric acid and water mixture with a boiling point less than 140° C., which would have a concentration of P$_2$O$_5$ that by weight percent is less than about 58%. More preferably, the second phosphoric acid bath 24 has a boiling point of less than about 130° C. or the concentration of P$_2$O$_5$ of about 56%. More preferably, the second phosphoric acid bath 22 has a boiling point of about 130° C. or the concentration of P$_2$O$_5$ is about 56%. A second heater 71 is connected to the second phosphoric acid bath 24 and heats the phosphoric acid to the boiling point. A second changing system 73 is connected to the second phosphoric acid bath 24 and replaces older phosphoric acid with fresh phosphoric acid. A second recondenser 75 is connected to the second phosphoric acid bath 24 keeping the second phosphoric acid bath in a closed system by recondensing vapor from the second phosphoric bath 24 back into the second phosphoric bath 24.

FIG. 3 is a cross-sectional view of part of a semiconductor wafer 30 with an incomplete LOCOS structure. The semiconductor wafer 30 is used as a substrate. In operation, a thin layer of silicon dioxide is grown on the surface of the wafer 30 to form a pad oxide layer 32. A silicon nitride layer 34 is deposited over the pad oxide layer 32. Apertures are etched into the silicon nitride layer 34. An implant 36 may be placed in the regions of the apertures. Localized oxidation of the silicon (LOCOS) occurs within the apertures in the silicon nitride layer 34 forming field oxide regions 38 within the apertures in the silicon nitride layer 34. The creation of the field oxide regions 38 sometimes causes a thin oxide layer to form over the silicon nitride layer 34. Conventional, highly selective silicon nitride etching is slowed by the thin oxide layer formed over the silicon nitride layer.

To etch back the nitride layer 34, the semiconductor wafer 30 is placed in a carrier 28 on the conveyor system 26, as shown in FIG. 1. The conveyor system 26 moves the semiconductor wafer 30 to the first phosphoric acid bath 22. In the first phosphoric acid bath 22 the nitride is etched at a faster rate due to the higher temperature of the first acid bath 22. The first acid bath 22 is less selective, so that the oxide etch rate is closer to the nitride etch rate due to the higher temperature of the first acid bath 22; however, the pad oxide layer 32 is protected by the silicon nitride layer 34, when the silicon wafer 30 is in the first phosphoric acid bath 22. Since the first acid bath 22 is less selective, any thin oxide film formed over the silicon nitride layer 34 is more quickly etched away. Most of the nitride etching occurs in the first acid bath 22, in which the silicon has a higher saturation concentration due to the higher temperature, allowing the first acid bath to hold a higher concentration of silicon without precipitation. In addition, if some precipitation occurs which may cause a defect, further etching in the second phosphoric acid bath 22 may remove the defect.

The conveyor system 26 then removes the wafer 30 and carrier 28 out of the first phosphoric acid bath 22. FIG. 4 is a cross-sectional view of part of a semiconductor wafer 30 after it has been removed from the first phosphoric acid bath 22. Most of the silicon nitride layer 34 and some of the field oxide regions 38 have been etched away in the first acid bath 22. Since the pad oxide layer 32 is protected by the silicon nitride layer 34, the pad oxide layer 32 is not etched by the higher temperature first acid bath 22. Since the field oxide regions 38 are relatively thick, some etching of the field oxide regions 38 in the less selective first acid bath 22 is acceptable.

The conveyor system 26 next moves the semiconductor wafer 30 to the second phosphoric acid bath 24. In the second phosphoric acid bath 24 the nitride is etched at a slower rate due to the relatively lower temperature of the second acid bath 24. The second acid bath 24 is more selective, so that the nitride etch rate may be several times greater than the oxide etch rate due to the lower temperature of the second acid bath 24. Less nitride etching occurs in the second acid bath 24, since the nitride etch rate is slower than in the first acid bath 22. In the second acid bath 24 the silicon has a lower saturation concentration, causing the second acid bath to hold a lower concentration of silicon without precipitation. Since less etching is done in the second acid bath 24 and since the second acid bath 24 is more selective, the second changing system 73 may replace the old phosphoric acid less often, even with the lower silicon saturation concentration. The low concentration of silicon dissolved in the second acid bath 24 due to the smaller amount of etching done in the second acid bath 24 results in a lower number of defects due to silicon precipitation.

Figure 5:
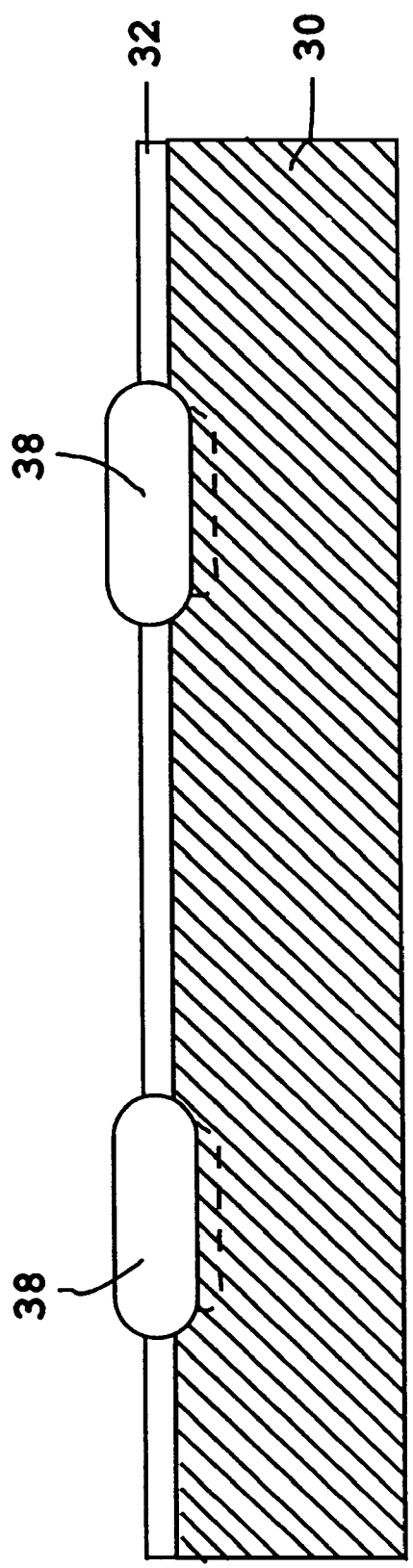
FIG. 5 is a cross-sectional view of the semiconductor wafer shown in FIG. 4 after removal from the second acid bath.

The conveyor system 26 then removes the wafer 30 and carrier 28 out of the second phosphoric acid bath 24. FIG. 5 is a cross-sectional view of part of a semiconductor wafer 30 after it has been removed from the second phosphoric acid bath 24. The remainder of the silicon nitride layer 34 has been etched away in the second acid bath 24. The lower temperature of the second acid bath 24 causes the second acid bath 24 to be more selective, having a much higher silicon nitride etching rate than oxide etching rate, which results in minimal oxide etching in the second acid bath 24. Therefore the pad oxide layer 32 and the field oxide regions 38 undergo minimal etching in the second acid bath 24, and the pad oxide layer 32 acts as a stop etch layer.

Conventional processes are then used to complete the structure.

Figure 6:
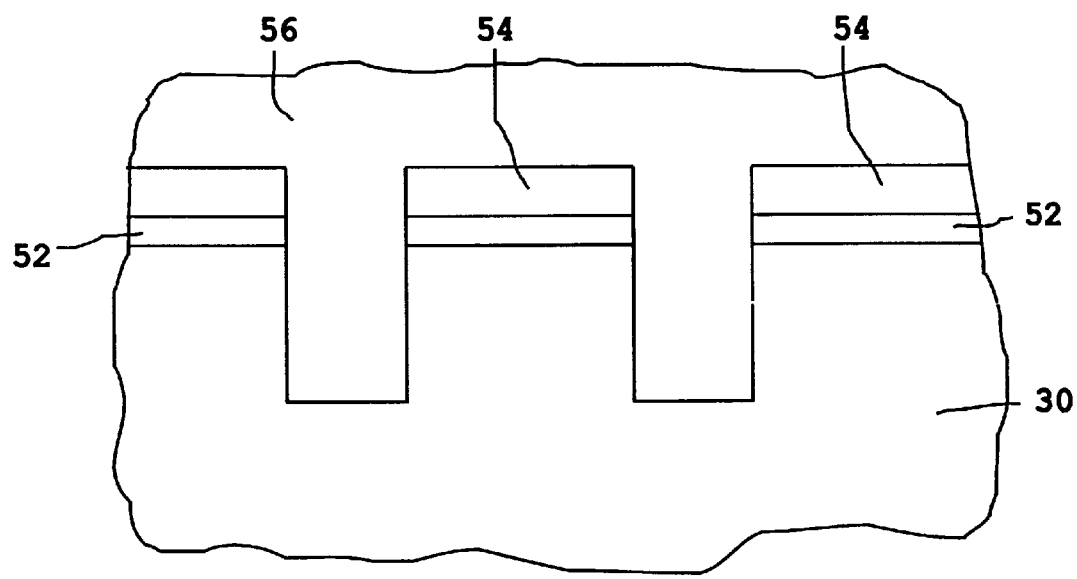
FIG. 6 is a cross sectional view of a semiconductor with an incomplete shallow trench isolation structure before polishing and nitride etching.

In another example of the operation of the invention, FIG. 6 is a cross-sectional view of part of a semiconductor wafer 30 with an incomplete shallow trench isolation (STI) structure. The semiconductor wafer 30 is used as a substrate. A thin layer of silicon dioxide is grown on the surface of the wafer 30 to form a pad oxide layer 52. A silicon nitride layer 54 is deposited over the pad oxide layer 52. Apertures are etched into the silicon nitride layer 54. Shallow trenches are etched into the semiconductor wafer 30 at the apertures in the silicon nitride layer 54. The trenches are filled with an oxide to form a trench oxide 56. The trench oxide 56 is polished back using the silicon nitride layer 54 as an oxide polish stop and leaving the trench oxide 56 in the trenches.

To etch back the nitride layer 54, the semiconductor wafer 30 is placed in a carrier 28 on the conveyor system 26. The conveyor system 26 moves the semiconductor wafer 30 to the first phosphoric acid bath 22. In the first phosphoric acid bath 22 the nitride is etched at a faster rate due to the higher temperature of the first acid bath 22. The first acid bath 22 is less selective, so that the oxide etch rate is closer to the nitride etch rate due to the higher temperature of the first acid bath 22; however, the pad oxide layer 52 is protected by the silicon nitride layer 54, when the silicon wafer 30 is in the first phosphoric acid bath 22. Most of the nitride etching occurs in the first acid bath 22, in which the silicon has a higher saturation concentration, allowing the first acid bath to hold a higher concentration of silicon without precipitation. In addition, if some precipitation occurs which may cause a defect, further etching in the second phosphoric acid bath 22 may remove the defect.

Figure 7:
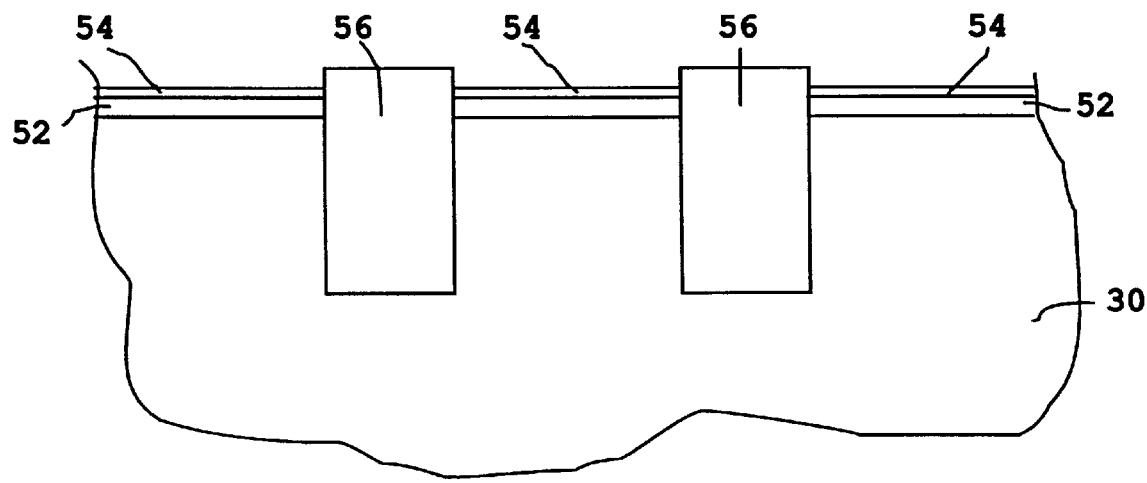
FIG. 7 is a cross sectional view of the semiconductor wafer shown in FIG. 6 after removal from the first acid bath.

The conveyor system 26 then removes the wafer 30 and carrier 28 out of the first phosphoric acid bath 22. FIG. 7 is a cross-sectional view of part of a semiconductor wafer 30 after it has been removed from the first phosphoric acid bath 22. Most of the silicon nitride layer 54 and some of the trench oxide 56 have been etched away in the first acid bath 22. Since the pad oxide layer 52 is protected by the silicon nitride layer 54 the pad oxide layer 52 is not etched by the higher temperature first acid bath 22. Since the trench oxide 56 is relatively thick, some etching of the trench oxide 56 in the less selective first acid bath 22 is acceptable.

The conveyor system 26 next moves the semiconductor wafer 30 to the second phosphoric acid bath 24. In the second phosphoric acid bath 24 the nitride is etched at a slower rate due to the relatively lower temperature of the second phosphoric acid bath 24. The second phosphoric acid bath 24 is more selective, so that the nitride etch rate may be several times greater than the oxide etch rate due to the lower temperature of the second phosphoric acid bath 24. Less nitride etching occurs in the second phosphoric acid bath 24, since the nitride etch rate is slower than in the first acid bath 22. In the second phosphoric acid bath 24 the silicon has a lower saturation concentration, causing the second phosphoric acid bath 24 to hold a lower concentration of silicon without precipitation. Since less etching is done in the second phosphoric acid bath 24 and since the second phosphoric acid bath 24 is more selective, the second changing system 73 may replace the old phosphoric acid less often, even with the lower silicon saturation concentration. The low concentration of silicon dissolved in the second phosphoric acid bath 24 due to the smaller amount of etching done in and the higher selectivity of the second phosphoric acid bath 24 results in a lower number of defects due to silicon precipitation.

Figure 8:
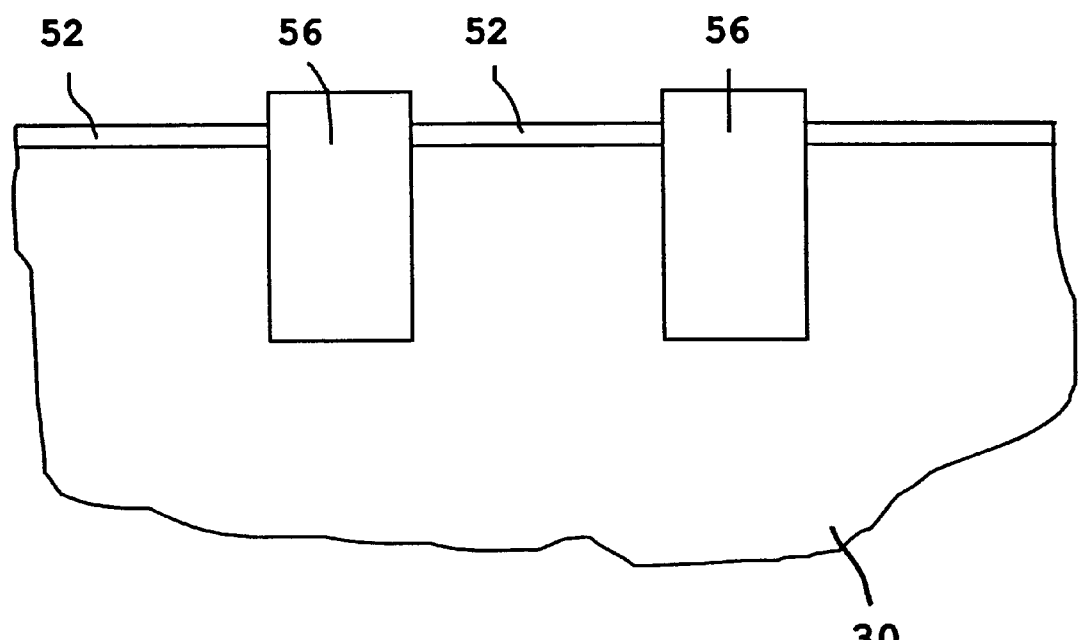
FIG. 8 is a cross sectional view of the semiconductor wafer shown in FIG. 7 after removal from the second acid bath.

The conveyor system 26 then removes the wafer 30 and carrier 28 out of the second phosphoric acid bath 24. FIG. 8 is a cross-sectional view of part of a semiconductor wafer 30 after it has been removed from the second phosphoric acid bath 24. The remainder of the silicon nitride layer 54 has been etched away in the second acid bath 24. The lower temperature of the second acid bath 24 causes the second acid bath 24 to be more selective, having a much higher silicon nitride etching rate than oxide etching rate, which results in minimal oxide etching in the second acid bath 24. Therefore the pad oxide layer 52 and the trench oxide 56 undergo minimal etching in the second acid bath 24, and the pad oxide layer 52 acts as a stop etch layer.

Conventional processes are then used to complete the structure.

In another embodiment of the invention, the wafer is first placed in a phosphoric acid bath with a boiling point of less than about 130° C. or the concentration of $P_2O_5$ is less than about 56% and then second placed into a phosphoric acid bath with a boiling point greater than 160° C. and the concentration of $P_2O_5$ is greater than about 63%.

Information as herein shown and described in detail is fully capable of attaining the above-described object of the invention, it is understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for".

I claim:

1. A method of forming a device on a semiconductor substrate, comprising the steps of:

forming a nitride layer on the semiconductor substrate;

providing a first bath of phosphoric acid ($H_3PO_4$) comprising phosphorus oxide ($P_2O_5$) in a concentration range of greater than about 63 weight %;

heating the first bath until the phosphoric acid boils, thereby generating a first bath vapor;

recondensing the first bath vapor from the first bath, thereby forming a recondensed first bath vapor;

directing the recondensed first bath vapor into the first bath;

providing a second bath of phosphoric acid ($H_3PO_4$) comprising phosphorus oxide ($P_2O_5$) in a concentration range of less than about 58 weight %;

heating the second bath until the phosphoric acid boils, thereby generating a second bath vapor;

recondensing the second bath vapor from the second bath, thereby forming a recondensed second bath vapor;

directing the recondensed second bath vapor into the second bath;

etching away part of the nitride layer by placing the semiconductor substrate with the nitride layer into the first bath;

removing the semiconductor substrate from the first bath;

etching away part of the nitride layer by placing the semiconductor substrate with the nitride layer into the second bath; and removing the semiconductor substrate from the second bath.

2. The method, as recited in claim 1, wherein the boiling point of the phosphoric acid in the first bath is greater than about 160° C. and wherein the phosphoric acid in the first bath is heated to a temperature greater than about 160° C., and wherein the boiling point of the phosphoric acid in the second bath is less than about 140° C., and wherein the phosphoric acid in the second bath is heated to a temperature less than about 140° C.

3. The method, as recited in claim 1, wherein for the first bath the concentration of $P_2O_5$ by weight percent is greater than 65%, and wherein for the second bath the concentration of $P_2O_5$ by weight percent is less than 56%.

4. The method, as recited in claim 1, wherein for the first bath the concentration of $P_2O_5$ by weight percent is about 65%, and wherein for the second bath the concentration of $P_2O_5$ by weight percent is about 56%.

5. The method, as recited in claim 1, further comprising the step of forming a thin oxide layer between the nitride layer and the semiconductor substrate.

6. The method, as recited in claim 5, wherein the thin oxide layer is an etch stop for the etching away part of the nitride layer by placing the semiconductor substrate with the nitride layer into the first bath.

7. The method, as recited in claim 1, further comprising the step of conveying the semiconductor substrate from the first bath to the second bath.

8. A method of manufacturing a semiconductor chip, comprising the steps of:
   providing a semiconductor substrate;
   forming a thin oxide layer on a surface of the semiconductor substrate;
   forming a nitride layer over the thin oxide layer;
   providing a first bath of phosphoric acid ($H_3PO_4$) comprising phosphorus oxide ($P_2O_5$) in a concentration range of greater than about 63 weight %;
   heating the first bath until the phosphoric acid boils, thereby generating a first bath vapor;
   recondensing the first bath vapor from the first bath, thereby forming a recondensed first bath vapor;
   directing the recondensed first bath vapor into the first bath;
   providing a second bath of phosphoric acid ($H_3PO_4$) comprising phosphorus oxide ($P_2O_5$) in a concentration range of less than about 58 weight %;
   heating the second bath until the phosphoric acid boils, thereby generating a second bath vapor;
   recondensing the second bath vapor from the second bath, thereby forming a recondensed second bath vapor;
   directing the recondensed second bath vapor into the second bath;
   etching away part of the nitride layer by placing the semiconductor substrate with the nitride layer into the first bath;
   removing the semiconductor substrate from the first bath;
   etching away part of the nitride layer by placing the semiconductor substrate with the nitride layer into the second bath; and
   removing the semiconductor substrate from the second bath.

9. The method, as recited in claim 8, further comprising the steps of:
   forming at least one aperture within the nitride layer and the thin oxide layer; and
   forming an oxide layer within the at least one aperture.

10. The method, as recited in claim 8, wherein the step of etching away part of the nitride layer by placing the semiconductor substrate with the nitride layer in the second bath, etches away remaining nitride and uses the thin oxide layer as an etch stop.

11. The method, as recited in claim 10, further comprising the step of conveying the semiconductor substrate from the first bath to the second bath.

12. A method of forming a device on a semiconductor substrate, comprising the steps of:
   forming a nitride layer on the semiconductor substrate;
   providing a first bath of phosphoric acid ($H_3PO_4$) comprising phosphorus oxide ($P_2O_5$) in a concentration range of less than about 56 weight %, the first bath having a boiling point of less than about 130° C.;
   heating the first bath until the phosphoric acid boils, thereby generating a first bath vapor;
   recondensing the first bath vapor from the first bath, thereby forming a recondensed first bath vapor;
   directing the recondensed first bath vapor into the first bath;
   providing a second bath of phosphoric acid ($H_3PO_4$) comprising phosphorus oxide ($P_2O_5$) in a concentration range of greater than about 63 weight %, the second bath having a boiling point greater than 160° C.;
   heating the second bath until the phosphoric acid boils, thereby generating a second bath vapor;
   recondensing the second bath vapor from the second bath, thereby forming a recondensed second bath vapor;
   directing the recondensed second bath vapor into the second bath;
   etching away part of the nitride layer by placing the semiconductor substrate with the nitride layer into the first bath;
   removing the semiconductor substrate from the first bath;
   etching away part of the nitride layer by placing the semiconductor substrate with the nitride layer into the second bath; and removing the semiconductor substrate from the second bath.

* * * * *

UNITED STATES PATENT AND TRADEMARK OFFICE
CERTIFICATE OF CORRECTION

PATENT NO. : 6,245,681 B1  
DATED : June 12, 2001  
INVENTOR(S) : Jeffrey A. Shields Page 1 of 1

It is certified that error appears in the above-identified patent and that said Letters Patent is hereby corrected as shown below:

Column 3,  
Line 1, delete [$3H_2O+P_2O_52H_3PO_46H+2PO_4^{+3}$] and replace with  
-- $3H_2O + P_2O_5 \rightleftharpoons 2H_3PO_4 \rightleftharpoons 6H^+ + 2PO_4^{+3}$]

Signed and Sealed this

First Day of January, 2002

Attest:

JAMES E. ROGAN  
*Attesting Officer*     *Director of the United States Patent and Trademark Office*